US012663732B2

(12) United States Patent
Yang et al.

(10) Patent No.: US 12,663,732 B2
(45) Date of Patent: *Jun. 23, 2026

(54) SYSTEM AND METHOD FOR THERMAL MANAGEMENT OF RETICLE IN SEMICONDUCTOR MANUFACTURING

(71) Applicant: Taiwan Semiconductor Manufacturing Company, Ltd., Hsinchu (TW)

(72) Inventors: Yueh-Lin Yang, Tainan City (TW); Chi-Hung Liao, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/401,729

(22) Filed: Jan. 2, 2024

(65) Prior Publication Data

US 2024/0134293 A1    Apr. 25, 2024

Related U.S. Application Data

(63) Continuation of application No. 17/665,605, filed on Feb. 7, 2022, now Pat. No. 11,899,377, which is a continuation of application No. 16/845,077, filed on Apr. 10, 2020, now Pat. No. 11,243,478.

(60) Provisional application No. 62/880,665, filed on Jul. 31, 2019.

(51) Int. Cl.
*G03F 7/00* (2006.01)

(52) U.S. Cl.
CPC ...... *G03F 7/70875* (2013.01); *G03F 7/70633* (2013.01); *G03F 7/70891* (2013.01)

(58) Field of Classification Search
CPC ............ G03F 7/70633; G03F 7/70875; G03F 7/70891; G03F 7/705
See application file for complete search history.

(56) References Cited

U.S. PATENT DOCUMENTS

| | | | | |
|---|---|---|---|---|
| 5,894,341 A * | 4/1999 | Nishi | .................. | G03F 7/70066 |
| | | | | 355/68 |
| 2006/0209284 A1* | 9/2006 | Kobayashi | .......... | G03F 7/70858 |
| | | | | 355/53 |
| 2006/0256305 A1* | 11/2006 | Won | ........................ | G03B 27/52 |
| | | | | 355/75 |
| 2009/0323039 A1* | 12/2009 | Wardenier | .......... | G03F 7/70666 |
| | | | | 355/77 |
| 2014/0272717 A1* | 9/2014 | Cheng | ........................ | G03F 7/00 |
| | | | | 716/55 |
| 2018/0259859 A1* | 9/2018 | Kant | ........................ | G03F 7/705 |
| 2018/0275525 A1* | 9/2018 | Bow | .................. | G03F 7/70875 |
| 2022/0357676 A1* | 11/2022 | Chang | ................ | G03F 7/70033 |
| 2023/0251583 A1* | 8/2023 | Voznyi | .................. | G03F 7/7085 |
| | | | | 430/30 |

* cited by examiner

*Primary Examiner* — Deoram Persaud
(74) *Attorney, Agent, or Firm* — JCIPRNET

(57) ABSTRACT

A semiconductor processing method includes: selecting a target state of a reticle based on a given data set, wherein the given data set comprises temperature profiles of the reticle correlated to a target overlay performance, and the target state is a state in which a deformation of the reticle is substantially unchanged; regulating the reticle to reach the target state; and performing an exposure process on a target workpiece by using the reticle.

20 Claims, 12 Drawing Sheets

Exposing a sample workpiece by using a sample reticle — S202

Measuring the sample reticle and the sample workpiece — S204

Repeating the exposing and the measuring — S206

Correlating the measurement of the sample reticle and the sample workpiece to generate a sample data — S208

200A

Determining a saturation temperature of a reticle based on the sample data — S210

Determining the temperature difference by comparing the saturation temperature with the current temperature of the reticle in the reticle library — S220

Regulating the temperature of the reticle in the reticle library based on the temperature difference — S230

200B

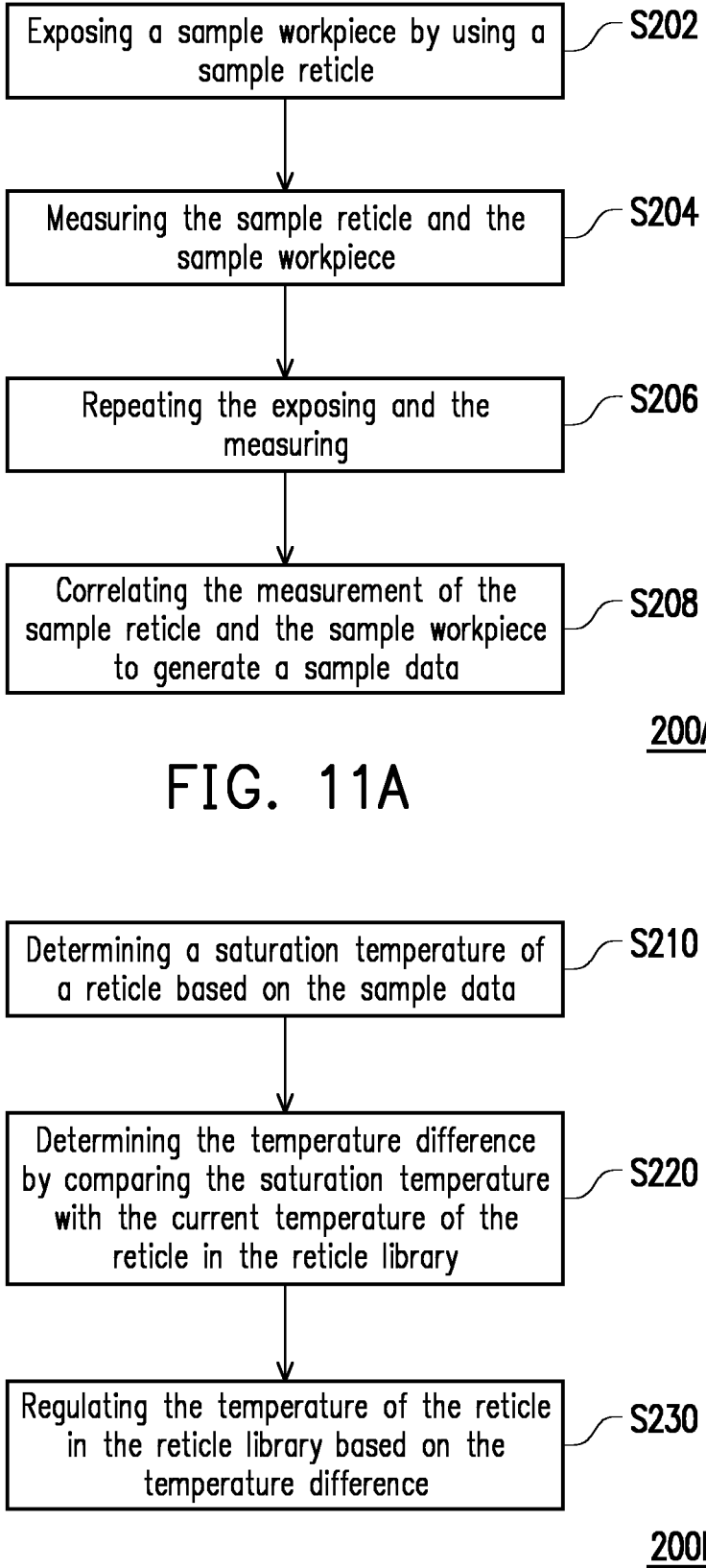

Exposing a sample workpiece by using a sample reticle ⌐ S202

Measuring the sample reticle and the sample workpiece ⌐ S204

Repeating the exposing and the measuring ⌐ S206

Correlating the measurement of the sample reticle and the sample workpiece to generate a sample data ⌐ S208

Determining a saturation temperature of a reticle based on the sample data ⌐ S210

Determining the temperature difference by comparing the saturation temperature with the current temperature of the reticle in the reticle library ⌐ S220

Regulating the temperature of the reticle in the reticle library based on the temperature difference ⌐ S230

SYSTEM AND METHOD FOR THERMAL MANAGEMENT OF RETICLE IN SEMICONDUCTOR MANUFACTURING

CROSS-REFERENCE TO RELATED APPLICATION

This application is a continuation application of and claims the priority benefit of a prior application Ser. No. 17/665,605, filed on Feb. 7, 2022, now allowed. The prior application Ser. No. 17/665,605 is a continuation application of and claims the priority benefit of a prior application Ser. No. 16/845,077, filed on Apr. 10, 2020. The prior application Ser. No. 16/845,077 claims the priority benefit of U.S. provisional application Ser. No. 62/880,665, filed on Jul. 31, 2019. The entirety of each of the above-mentioned patent application is hereby incorporated by reference herein and made a part of this specification.

BACKGROUND

As semiconductor devices are being scaled down, the complexity of integrated circuit (IC) manufacturing is increased. For example, the need to perform higher resolution lithography processes grows. A reticle (or a photomask) to be used in a lithography process has a circuit pattern formed thereon and is to be transferred onto semiconductor wafers. During fabrication, the overlay caused by reticle heating may result in adverse impact to accuracy of pattern transfer and process yield. Accordingly, although the existing technologies have been adequate for their intended purposes, they have not been satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various workpieces are not drawn to scale. In fact, the dimensions of the various workpieces may be arbitrarily increased or reduced for clarity of discussion.

FIG. 11A is a flow diagram illustrating an operating method of generating a sample data according to some embodiments.

FIG. 11B is a flow diagram illustrating an operating method of reticle thermal management in semiconductor manufacturing according to some embodiments.

DETAILED DESCRIPTION

Figure 1:
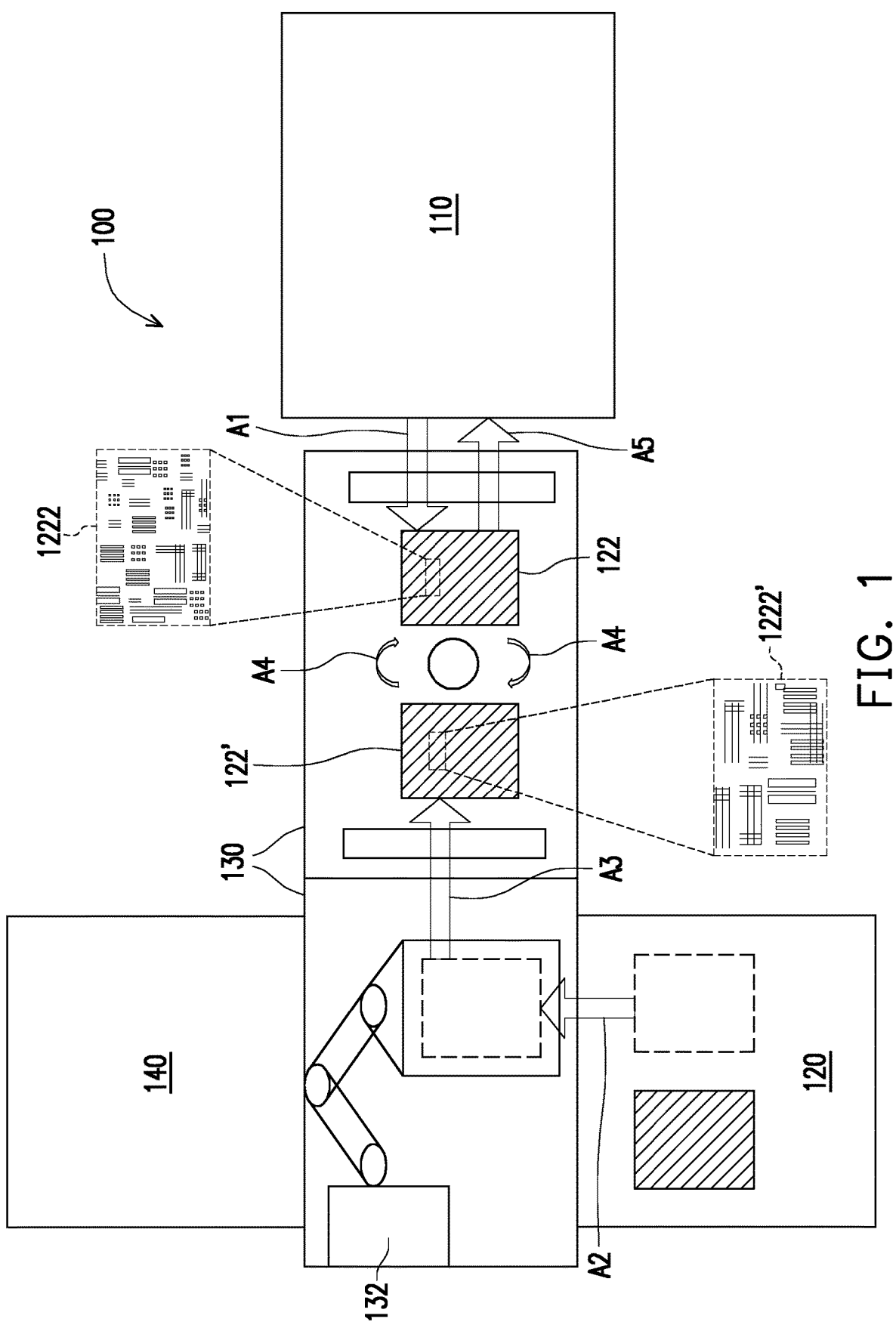
FIG. 1 and FIG. 2 are schematic views illustrating a semiconductor processing system according to some embodiments.

The following disclosure provides many different embodiments, or examples, for implementing different workpieces of the provided subject matter. Specific examples of components and arrangements are described below to simplify the present disclosure. These are, of course, merely examples and are not intended to be limiting. For example, the formation of a first workpiece over or on a second workpiece in the description that follows may include embodiments in which the first and second workpieces are formed in direct contact, and may also include embodiments in which additional workpieces may be formed between the first and second workpieces, such that the first and second workpieces may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or workpiece's relationship to another element(s) or workpiece(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
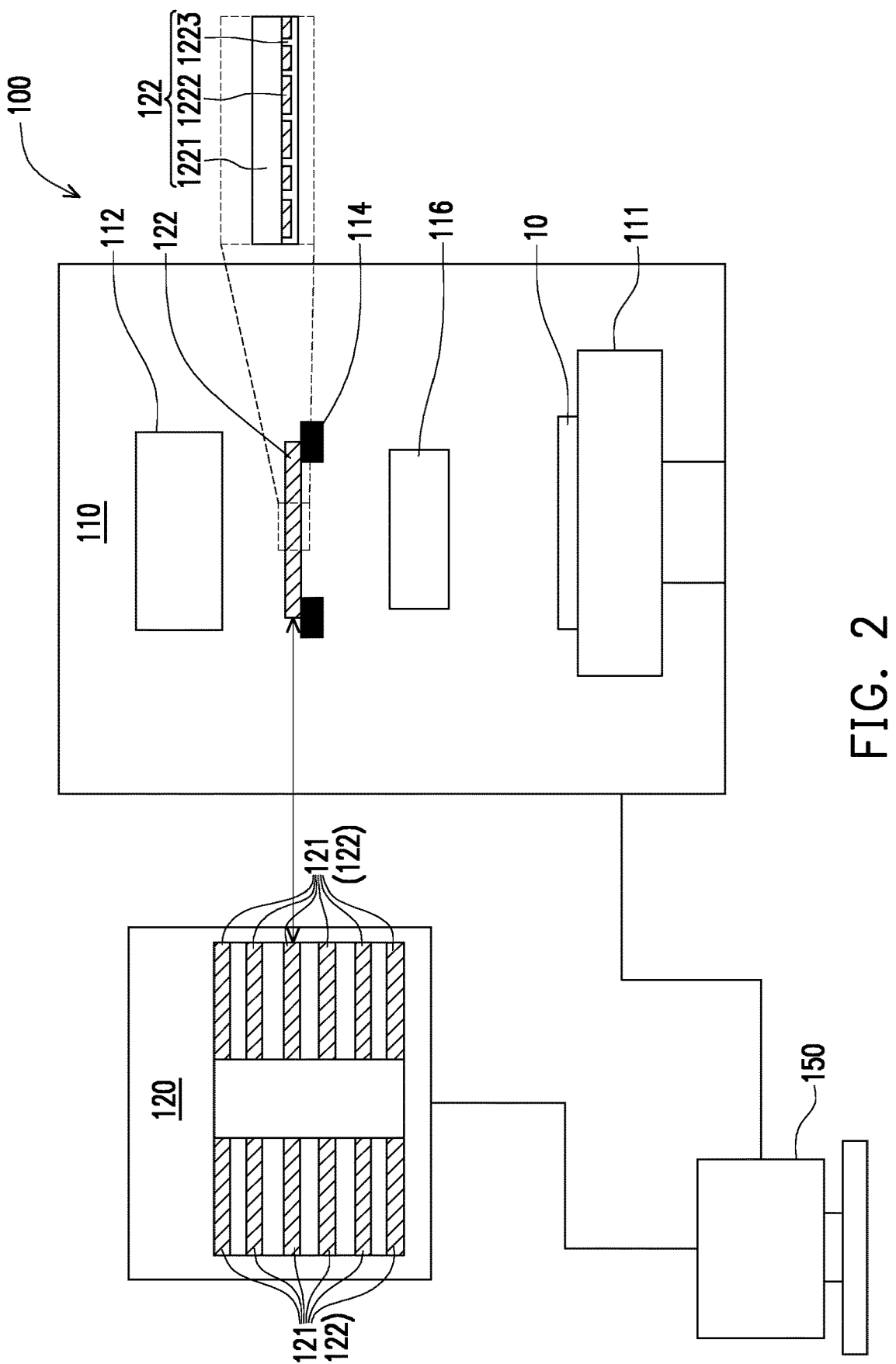
Figure 3:
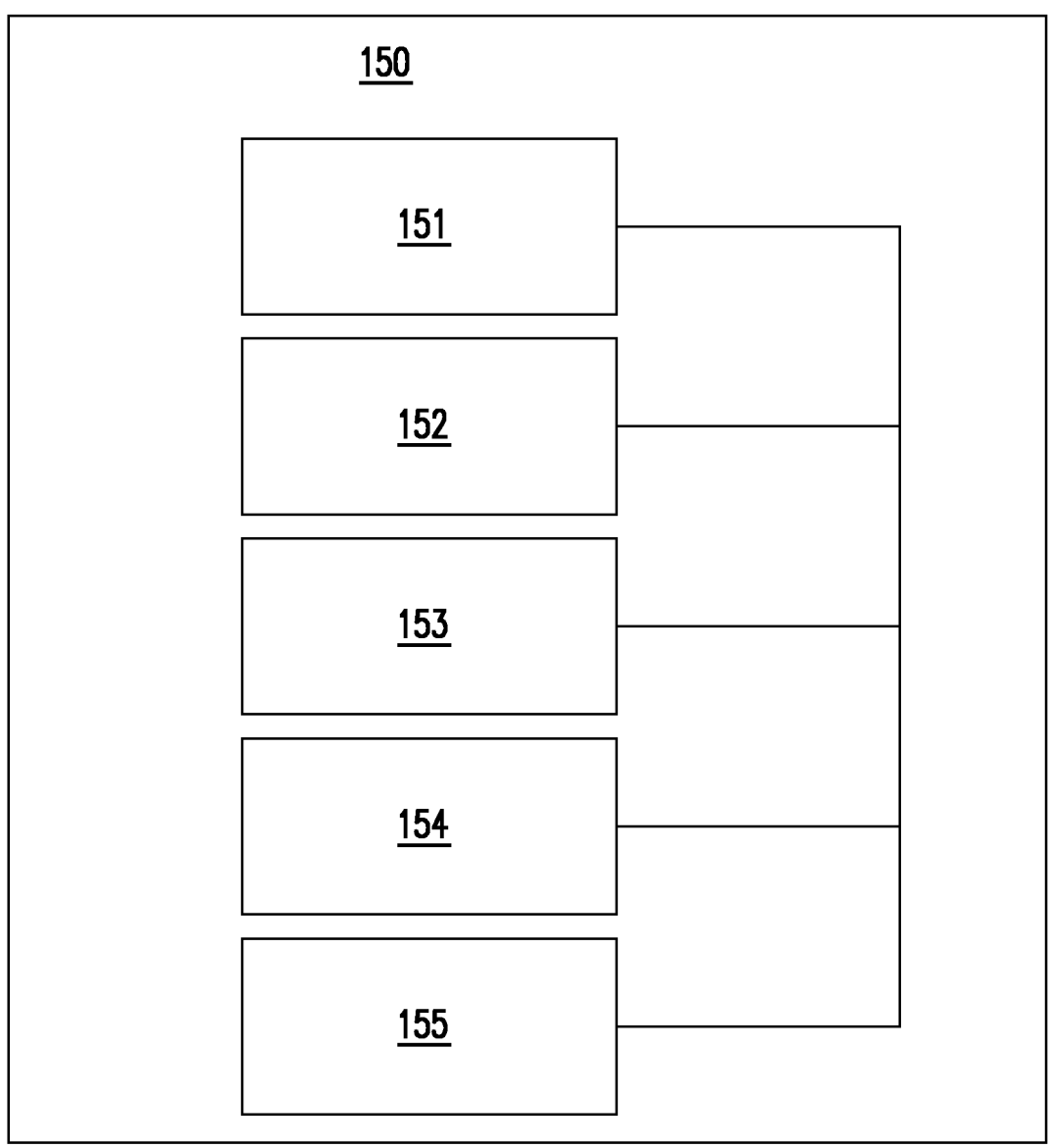
FIG. 3 is a block diagram illustrating a computing device of a semiconductor processing system according to some embodiments.

FIG. 1 and FIG. 2 are schematic views illustrating a semiconductor processing system according to some embodiments, and FIG. 3 is a block diagram illustrating a computing device of a semiconductor processing system according to some embodiments. Referring to FIG. 1 and FIG. 2, a semiconductor processing system 100 is provided for performing a lithography exposure process. For example, the semiconductor processing system 100 is used to fabricate a semiconductor workpiece 10 having small geometry sizes. The semiconductor processing system 100 may be used to perform high resolution lithography processes on the semiconductor workpiece 10.

In some embodiments, the semiconductor processing system 100 includes an exposure area 110, a reticle library 120, an interchange area 130, and a reticle load port 140. Exposure tools including illumination unit 112 and optical unit 116 are disposed in the exposure area 110 and may be configured to expose the semiconductor workpiece 10 to the illumination beam through use of a reticle 122. The reticle 122 may be a loading platform configured to receive a reticle pod (not shown) from the transportation tool (not shown), where the reticle pod may contain a plurality of reticles.

The reticle library 120 may be configured to temporarily store one reticle 122 or a plurality of reticles 122. For example, the reticle library 120 includes a plurality of slots 121, and each of the reticles 122 is disposed on one of the slots 121. It should be noted that the illustration of the slots 121 arranged in two columns is merely an example. The configuration of the slots 121 may vary depending on requirements.

A robotic handling mechanism 132 may be disposed within the interchange area 130 for transferring the reticle 122 among the reticle load port 140, the reticle library 120, and the exposure area 110. In some embodiments, the robotic handling mechanism 132 is configured to transfer the reticles 122 from the reticle load port 140 to the reticle library 120. When any of the reticles 122 stored in the reticle library 120 is needed, the reticle 122 may be transferred by the robotic handling mechanism 132 from the reticle library 120 through the interchange area 130 to the exposure area 110.

Shown in FIG. 2, a chuck 111 is located in the exposure area 110 and configured to hold the semiconductor workpiece 10 to be processed thereon. The semiconductor workpiece 10 may be a lithographic target such as a semiconductor wafer or a photosensitive layer formed over a semiconductor wafer. In some embodiments, the chuck 111 is an electrostatic chuck (E-chuck) which uses an electric force to secure the semiconductor workpiece 10 that is to be processed. In some embodiments, the chuck 111 includes clamps to secure the semiconductor workpiece 10. In some embodiments, the chuck 111 is configured to generate vacuum pressures through vacuum ports in the chuck to hold the semiconductor workpiece 10 thereon. The semiconductor workpiece 10 may be mounted by other appropriate mounting force via the chuck 111.

An illumination unit 112 in the exposure area EC may be configured to generate the illumination beam. The illumination beam may be any suitable light source, such as ultraviolet (UV) radiation, visible light radiation, deep UV (DUV) source, extreme UV (EUV) source, X-ray source, or the like. In some embodiments, to achieve a required exposure dose, the illumination unit 112 is of a relatively high energy or high level of flux. In some embodiments, the illumination unit 112 includes a single lens or a lens module having multiple lenses and/or other optical components. It should be noted that any suitable technique may be employed to emit light to achieve high resolution for the semiconductor workpiece 10 to be processed.

In some embodiments, a reticle holder 114 is located in the exposure area 110 and configured to hold the reticle 122. The reticle holder 114 may be operable to position the reticle 122 as required for alignment of the reticle 122 relative to the semiconductor workpiece 10, thereby achieving accurate exposure. In some embodiments, the reticle holder 114 includes a pair of fixing ends that are parallel to each other, and the reticle 122 is supported by the pair of fixing ends. In some embodiments, the reticle 122 includes a substrate 1221 and a pattern 1222 disposed on the substrate 1221. The material of the substrate 1221 may be or may include quartz, glass, a transparent material, and/or other suitable material(s). The material of the pattern 1222 may be or may include conductive material (e.g., chromium), absorption material, and/or other suitable materials for either absorbing or reflecting the illumination beam. In some embodiments, the reticle 122 includes a protection layer 1223 formed on the substrate 1221 and covering the pattern 1222 for protection. The protection layer 1223 may be transparent to the illumination beam. For example, the absorption material is formed and patterned on the substrate 1221 to form the pattern 1222 with one or more openings. The illumination beam may be partially or completely blocked when directed on the pattern 1222, and the illumination beam may transmit without being absorbed through the openings of the pattern 1222.

In some embodiments, an optical unit 116 is located in the exposure area 110 and configured to image at least a portion of the pattern 1222 of the reticle 122 onto the semiconductor workpiece 10 to be processed. For example, the optical unit 116 and the semiconductor workpiece 10 are disposed downstream of the reticle 122. The optical unit 116 may include lens(es), reflective mirror(s), condenser(s), or the like. The position of the optical unit 116 in the exposure area 110 may be adjusted as required for accurate exposure and/or for a compensation procedure. It should be noted that the configuration in the exposure area 110 shown in FIG. 2 is an example illustrated in a simplified manner. In some embodiments, the exposure tool is a stepper, and the exposure location is exposed to the entire pattern of the reticle at one time. In some embodiments, the exposure tool is a scanner, and the exposure location is gradually exposed to the pattern of the reticle when scanning the pattern across the exposure location.

With reference to FIG. 2 and FIG. 3, in some embodiments, the semiconductor processing system 100 includes a computing device 150 at least coupled to the reticle library 120 and the exposure area 110. For example, the computing device 150 includes a processor 151 which may controllably operate one or more reticles 122 to be transferred between the reticle library 120 and the exposure area 110. In some embodiments, the processor 151 is implemented as one or more processors such as a central processing unit (CPU), a multi-processor, an application specific integrated circuit (ASIC), and/or a suitable processing unit. In some embodiments, the processor 151 is adapted to compute data related to the reticle 122 which is explained later in other embodiments. The processor 151 may be operatively connected to a storage medium 152 and a controller 153. For example, the storage medium 152 (e.g., a memory and/or data storage) may store data, parameters, formulae, and/or information that may be utilized to perform the various processes discussed herein. The controller 153 may be controlled by the processor 151 and may carry out aspects of the various processes discussed herein. The computing device 150 may include a network connection 154 and a user interface 155 which are operatively connected to the processor 151. In some embodiments, the network connection 154 facilitates a physical connection or a wireless connection with various devices and/or components that may communicate within or external to the computing device 150. The user interface 155 may include any type of interface for input and/or output to an operator of the semiconductor processing system 100, including, a laptop, a tablet, a monitor, a mobile device, or the like.

Referring back to FIG. 1 and FIG. 2, in some embodiments, the reticle 122 including the pattern 1222 is used to pattern the semiconductor workpiece 10 through performing the exposure process. In some embodiments, when the exposure process is performed using the semiconductor processing system 100, the illumination beam from the illumination unit 112 may pass through the reticle 122 and through the optical unit 116, and then the pattern 1222 of the reticle 122 is transferred onto the semiconductor workpiece 10. In some embodiments, as the semiconductor workpiece 10 is further processed, another pattern 1222' may need to be transferred onto the semiconductor workpiece 10. In some embodiments, the pattern 1222 and the pattern 1222' have different distributions. The density distribution in given area of the pattern 1222 of the reticle 122 may be denser than that of the pattern 1222' of the reticle 122' as shown in FIG. 1. It should be noted that the pattern density distribution illustrated herein is merely an example. The reticle 122 may be replaced with another reticle which includes a sparse pattern, in accordance with some embodiments.

In some embodiments in which the reticle 122 is replaced with another reticle 122' (FIG. 1), the reticle 122 is removed from the reticle holder 114 and moved out of the exposure area 110 as indicated by the arrow A1, and the reticle 122' with another pattern 1222' is moved out from the reticle library 120 as indicated by the arrow A2 and transferred by the robotic handling mechanism 132 in the interchange area 130 as indicated by the arrow A3, as shown in FIG. 1. Next, the positions of the reticles 122 and 122' are interchanged in the interchange area 130 as indicated by the arrows A4, and then the reticle 122' with another pattern 1222' is moved into the exposure area 110 for further processing as indicated by the arrow A5. The reticle 122 may be subsequently stored in the reticle library 120.

Figures 4A, 4B:
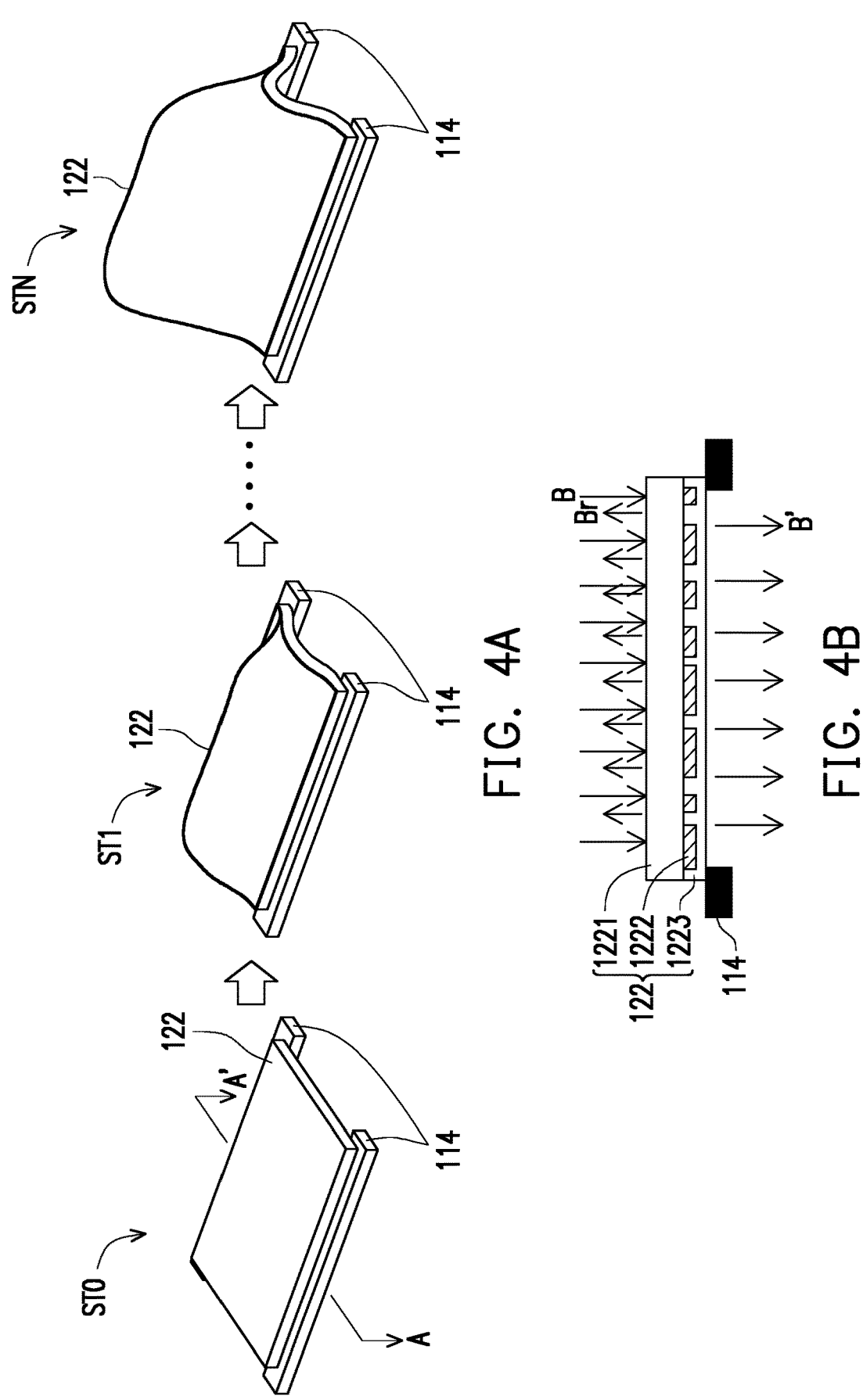
FIG. 4A is a schematic view illustrating a series of reticle changes after reticle heating according to some embodiments.
FIG. 4B is a schematic cross-sectional view illustrating a reticle taken along line A-A' of FIG. 4A according to some embodiments.

FIG. 4A is a schematic view illustrating a series of reticle changes after reticle heating according to some embodiments and FIG. 4B is a schematic cross-sectional view illustrating a reticle taken along line A-A' of FIG. 4A according to some embodiments. Referring to FIG. 4A and FIG. 4B, the reticle 122 is held by the reticle holder 114 which includes a pair of fixing ends. In some embodiments, the reticle 122 is transferred from the reticle library 120 to the exposure area 110 (as shown in FIGS. 1 and 2) and then supported by the reticle holder 114. At this stage (e.g., before the exposure process), the reticle 122 is at the initial state ST0.

As the exposure process proceeds, the illumination beam B is directed onto the reticle 122 for transferring the pattern onto the first one of a plurality of semiconductor workpieces. At this stage, a state of the reticle 122 is changed from the initial state ST0 to the first state ST1. In some embodiments, after the step of exposing the first one of semiconductor workpieces and before the step of exposing the second one, the reticle 122 is in the first state ST1. In some embodiments, during the exposure process, most of the illumination beam B may transmit through the reticle 122 (e.g., the transmitted beam B'), a portion of the illumination beam B may be reflected by the reticle 122 (e.g., the reflected beam Br), and the remaining portion of the illumination beam B may be absorbed by the reticle 122. In some embodiments, at portions of the reticle 122 having lower light transmission rate, the reticle 122 absorbs the illumination beam B and experiences local thermal deformation. The absorbed illumination beam may result in reticle heating, which leads to distortion on the reticle 122.

In some embodiments, heating and distortion of the reticle 122 are not uniform due to the light transmission rate of different regions in the reticle 122. For an open area of the reticle 122 where no pattern is distributed thereon, the illumination beam B may directly transmit through the open area of the reticle 122. In some embodiments, an area of the reticle 122 having denser pattern distributed thereon may be viewed as the area having lower light transmission rate, and an area of the reticle 122 having a sparse pattern distributed thereon may be viewed as the area having higher light transmission rate. In some embodiments, the distortion degree at portions of the reticle 122 having lower light transmission rate (hence higher absorption rate) is greater than the distortion degree at portions of the reticle 122 having higher light transmission rate (hence lower absorption rate). The edges of the reticle 122 fixed on the reticle holder 114 may be less deformed. In some embodiments, the distortion degree in the center region of the reticle 122 is greater than the distortion degree in the peripheral region of the reticle 122. The distortion of the reticle 122 may lead to changes of imaging characteristics of the pattern that is transferred onto the semiconductor workpiece.

After processing the first of a plurality of semiconductor workpieces is complete, the first semiconductor workpiece is removed from the chuck 111 (shown in FIG. 1). Next, the second semiconductor workpiece is placed on the chuck 111 and then subjected to the exposure process via the reticle 122. Similarly, the subsequent semiconductor workpieces following the second semiconductor workpiece may be subjected to the exposure process via the reticle 122 one by one. As the reticle 122 continues to undergo exposure and absorbs more energy from the illumination beam B, the reticle 122 may experience a higher degree of thermal distortion. When processing the $N^{th}$ semiconductor workpiece, the reticle 122 may reach its saturation state STN. The reticle 122 being in the saturation state STN means that the reticle 122 reaches a state of thermal expansion saturation. The temperature of the reticle 122 reaches the saturation temperature when the saturation state STN is reached. As such, when the reticle 122 reaches its saturation state STN, as the exposure process continues, the reticle 122 neither expands nor contracts. The reticle 122 being in the saturation state STN may retain a constant shape. In some embodiments, the reticle 122 in the saturation state STN undergoes only slight changes in its shape as the exposure process continues. In some embodiments, when processing the last one of the semiconductor workpieces, the reticle 122 reaches the saturation state STN. In other embodiments, before processing the last one of the semiconductor workpieces, the reticle 122 has already reached its saturation state STN.

Figure 5:
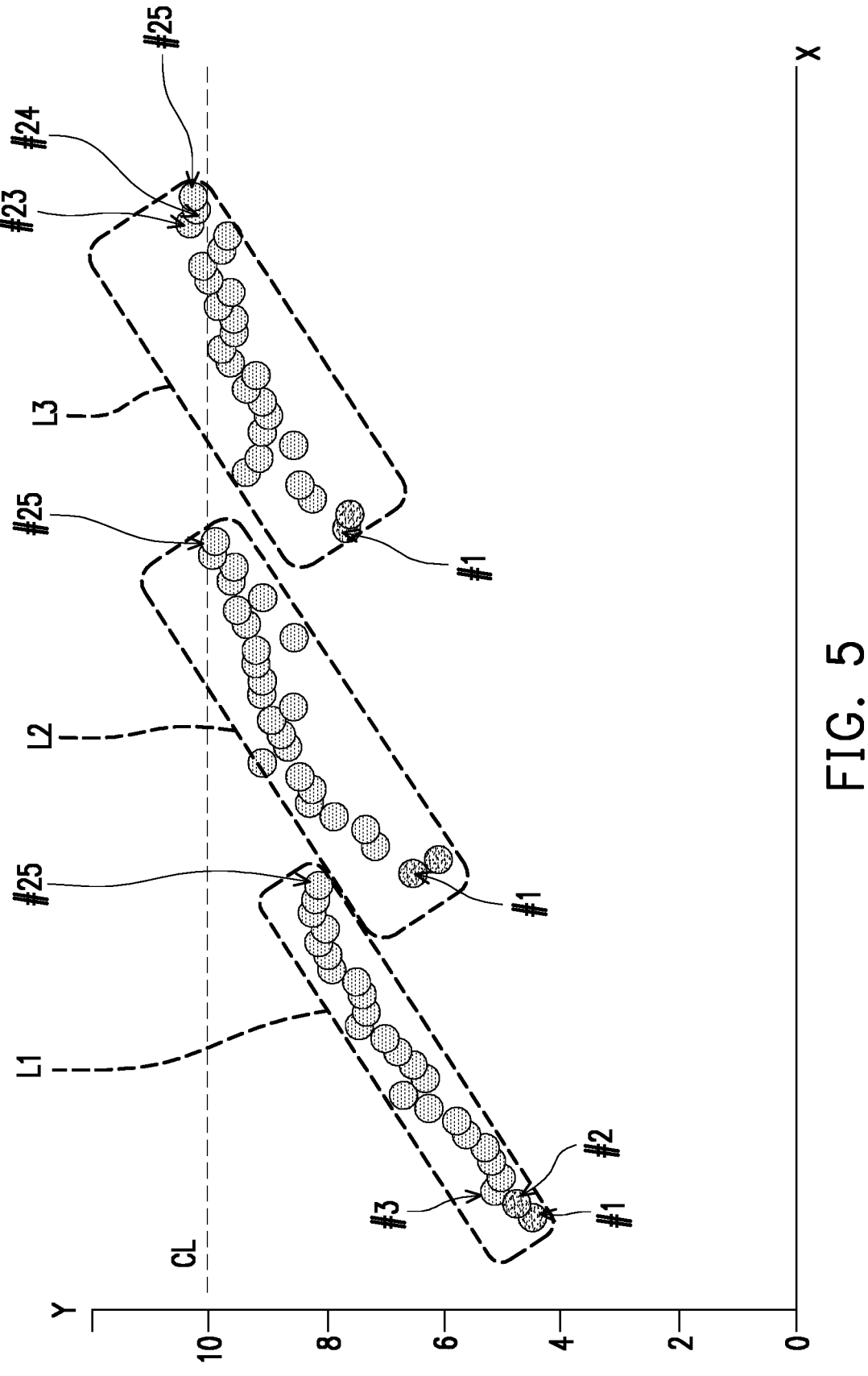
FIG. 5 is a schematic diagram of sample data corresponding to semiconductor workpieces of individual lots according to some embodiments.
Figure 6:
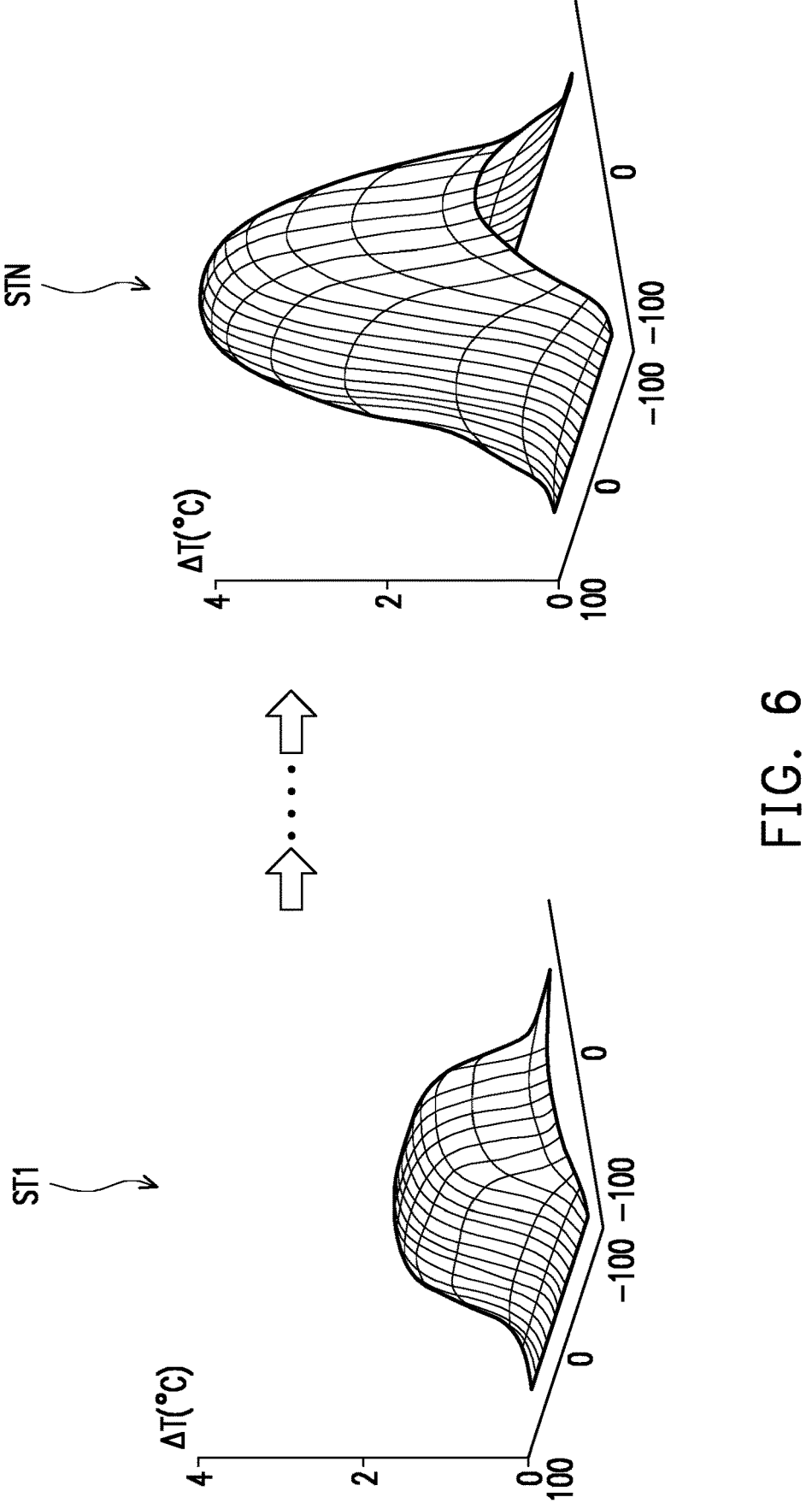
FIG. 6 is a schematic view illustrating temperature profiles of reticle in different states during processing according to some embodiments.
Figure 7:
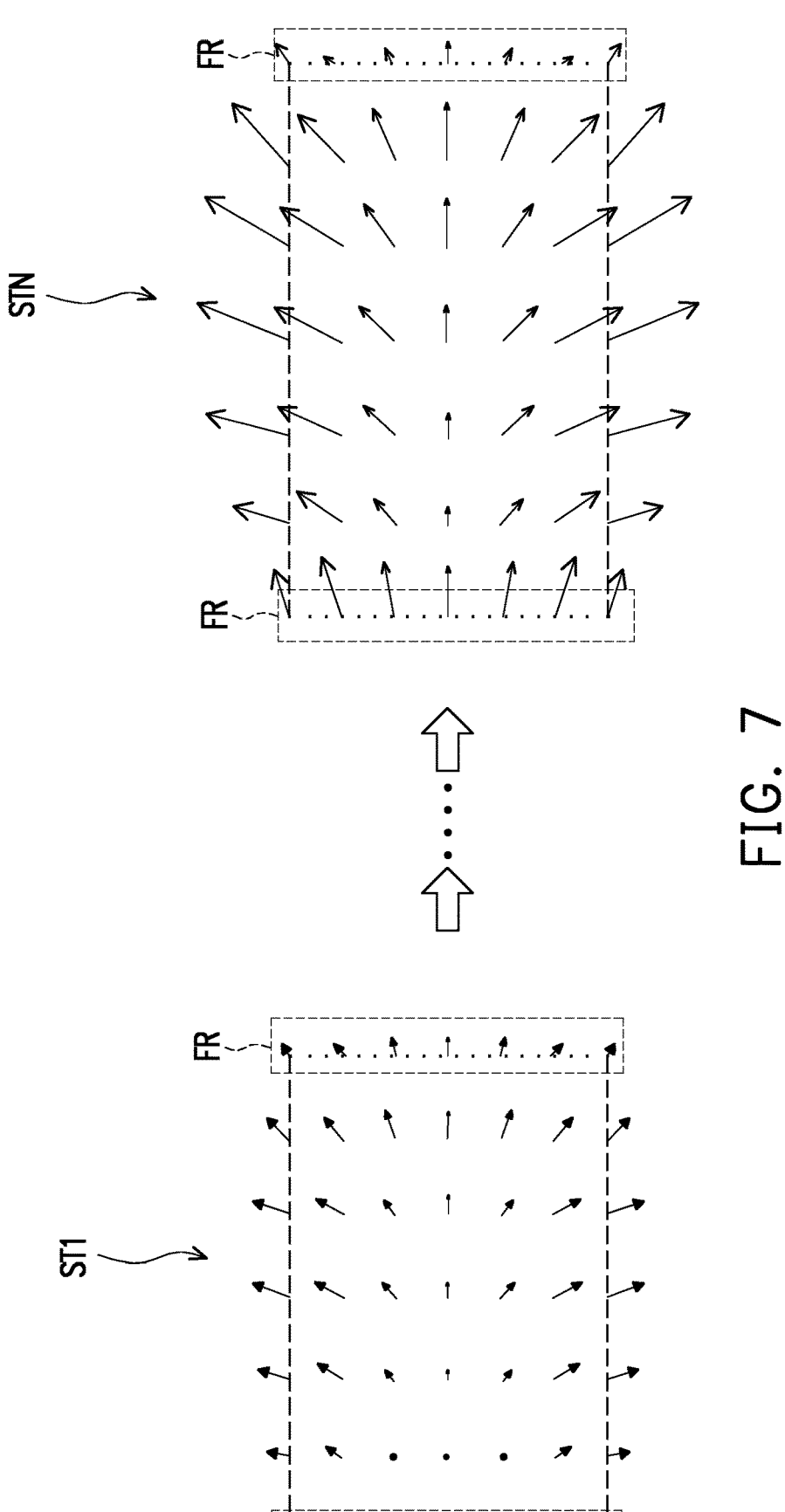
FIG. 7 is a schematic view illustrating distortion maps of reticle in different states during processing according to some embodiments.

FIG. 5 is a schematic diagram of sample data corresponding to semiconductor workpieces of individual lots according to some embodiments, FIG. 6 is a schematic view illustrating temperature profiles of a reticle in different states during processing according to some embodiments, and FIG. 7 is a schematic view illustrating distortion maps of a reticle in different states during processing according to some embodiments. It is appreciated that the term "lot" refers to a group of semiconductor workpieces which are processed at substantially the same time or over a substantially short period of time.

Referring to FIG. 5, FIG. 6, and FIG. 7, the overlay residual values of the respective processed semiconductor workpieces are determined after exposing semiconductor workpieces of individual lots through use of the reticle. In some embodiments, the overlay residual value is the difference between the measured value and the target. The data shown in FIG. 5 includes the Y axis (i.e. vertical axis) representing the overlay residual value, and the X axis (i.e. horizontal axis) representing data points corresponding to semiconductor workpieces of individual lots processed in time sequence. The data shown in FIG. 5 may be produced by sequentially processing the semiconductor workpieces via the same reticle, measuring the overlay residual values of the processed semiconductor workpieces of each lot, and measuring the temperature profiles of the reticle in different states that are used to process the semiconductor workpieces.

When processing the semiconductor workpieces one by one through the use of the same reticle, the predetermined pattern is formed on the respective semiconductor work-pieces using the exposure process as introduced above. For example, the exposure process is performed on the semi-conductor workpieces in a sample. The sample may include a plurality of semiconductor workpieces in at least one lot. In the illustrated embodiments, the sample includes three lots (e.g., L1, L2, L3), and the number of semiconductor workpieces in each lot may be 25. It should be noted that FIG. 5 is merely an example, and the sample may include any number of lots and each lot may include any number of semiconductor workpieces as long as sufficient measure-ment data are collected to determine the temperature profiles of the reticle in the saturation state. In some embodiments in which the lithography process is used to pattern the semi-conductor workpiece having a photosensitive layer formed over a semiconductor substrate, the semiconductor work-piece 10 and the reticle 122 are respectively disposed on the chuck 111 and the reticle holder 114 located in the exposure area 110 as shown in FIG. 2. Next, the semiconductor workpiece 10 and the reticle 122 are aligned. Subsequently, the illumination beam passes through the reticle 122 and is selectively shined on the photosensitive layer according to the pattern 1222 of the reticle 122 held by the reticle holder 114.

When measuring the overlay residual value of the respec-tive semiconductor workpiece in each lot, a variety of methods and metrology tools may be used to perform the overlay measurements of the processed semiconductor workpieces. For example, the overlay measurement is per-formed using scanning, imaging, and/or the like. In some embodiments in which the processed semiconductor work-piece includes the patterned layer and the underlying layer over the semiconductor substrate, the overlay residual value is determined by measuring the offset of patterned layer and the underlying layer. The overlay residual value may refer to the degree of alignment between the patterned layer and the underlying layer. For example, if the patterned layer and the underlying layer are not aligned precisely, the fiducial mark of the patterned layer may not match the fiducial mark of the underlying layer. In such embodiments, the overlay residual value exists. In some embodiments, the overlay is measured between two target features which indicate a relative shift at one area of the semiconductor workpiece relative to another area of the semiconductor workpiece.

In some embodiments, the exposure process is sequen-tially performed on the semiconductor workpieces in the three lots using the same reticle. In some embodiments, for the first lot L1, an increasing trend in the overlay residual values is observed due to reticle heating and reticle thermal deformation. In some embodiments, the overlay residual value of the semiconductor workpiece is greater than the overlay residual value of the previous semiconductor work-piece in the same lot due to the effects of reticle heating and reticle deformation. The overlay residual value of the third semiconductor workpiece (#3) in the first lot L1 is greater than the overlay residual values of the previous two of the semiconductor workpieces (#1 and #2) in the first lot L1. Similarly, for the second lot L2 and the third lot L3, the increasing trends in the overlay residual values were found.

After processing the last semiconductor workpiece (#25) of the first lot L1 and before the first semiconductor work-piece (#1) of the second lot L2 starts to be processed, or after processing the last semiconductor workpiece (#25) of the second lot L2 and before the first semiconductor workpiece (#1) of the third lot L3 starts to be processed, the reticle stops absorbing energy from the illumination beam, so that the reticle may gradually cool down. In some embodiments, the degree of reticle cooling is not sufficient to bring the reticle back to the initial state ST0. For example, the overlay residual value of the first semiconductor workpiece (#1) in the second lot L2 is greater than the overlay residual value of the first semiconductor workpiece (#1) in the first lot L1. The overlay residual value of the first semiconductor work-piece (#1) in the third lot L3 may be greater than the overlay residual value of the first semiconductor workpiece (#1) in the second lot L2.

A control limit CL is illustrated in FIG. 5. The control limit CL is determined based on the design of the features being formed on the semiconductor workpiece and the degree to which variation in the overlay affects the features. In some embodiments, the control limit CL is 10 nm. In such embodiments, the overlay in excess of the control limit CL indicates a problem (e.g., misalignment, a short circuit, or the like). In some embodiments, the semiconductor work-piece contains layers that are misaligned beyond the control limit CL, and then the misaligned layers need to be re-worked to correct such overlay. In some embodiments, as semiconductor workpieces are continuously processed using the same reticle in lots subsequent to the first lot, an increased number of processed semiconductor workpieces have the overlay residual values exceeding the control limit CL. In some embodiments, the overlay residual values of the semiconductor workpieces in the first lot L1 are all below the control limit CL, the overlay residual values of the last two semiconductor workpieces in the second lot L2 are very close to the control limit CL, and the overlay residual values of the last few semiconductor workpieces (e.g., #23, #24, and #25) in the third lot L3 are beyond the control limit CL. It is appreciated that the control limit CL illustrated in FIG. 5 is an example, and the control limit may be changed to different values depending on design specifications.

Referring to FIG. 6, temperature profiles of the reticle in different states used to process the semiconductor work-pieces are illustrated by the 3-dimensional axis diagram that has an X-axis, a Y-axis, and a Z-axis, where the X-Y axes represent dimensions of the pattern of the reticle, and the Z-axis represents temperature difference. When measuring the temperature profiles of the reticle in different states that is used to process the semiconductor workpieces, a variety of methods and metrology tools may be used to perform the temperature profile measurements of the reticle. In some embodiments, the temperature sensing unit (not shown) is disposed in the exposure area 110 (shown in FIG. 1) and configured to measure the temperature profiles of the reticle after processing the respective semiconductor workpieces in an individual lot. The temperature sensing unit may be operable to perform in-situ measurement. In other embodi-ments, the reticle is moved out to be measured and then moved back in place for performing the subsequent expo-sure process.

When performing the exposure process, portions of the reticle reflect the illumination beam and another portions of the reticle absorb energy from the illumination beam, so that a temperature difference ($\Delta T$) is produced on the reticle and leads to the thermal gradient on the reticle. The reticle may be distorted due to the temperature gradients within the reticle as shown in FIG. 6. In some embodiments, after the exposure process is performed on the first semiconductor workpiece (#1) in the first lot L1, the reticle is changed from the initial state ST0 (as shown in FIG. 4A) to be in the first state ST1. For example, in the first state ST1, the tempera-ture rise of the reticle ranges about 1° C. to about 2° C. In some embodiments, the maximum temperature difference ($\Delta T$) of the reticle being in the first state ST1 is substantially below 2° C. Alternatively, the maximum temperature difference (ΔT) of the reticle being in the first state ST1 is over 2° C. As processing the semiconductor workpieces following the first workpiece in the first lot L1, the reticle continues to undergo exposure and absorbs more energy from the illumination beam. In some embodiments, as processing the last semiconductor workpiece (#25) in the first lot L1, the reticle reaches the saturation state STN. For example, the maximum temperature difference (ΔT) of the reticle in the saturation state STN is substantially about 4° C. or beyond 4° C.

With reference to FIG. 5 and FIG. 6, after performing the last semiconductor workpiece (#25) in the first lot L1, the reticle stops absorbing energy from the illumination beam and may cool down until the first semiconductor workpiece (#1) in the second lot L2 starts to be processed. After performing the first semiconductor workpiece (#1) in the second lot L2, the maximum temperature difference (ΔT) of the reticle may be substantially similar to that of the reticle being in the first state ST1. In some embodiments, after processing the first semiconductor workpiece (#1) in the second lot L2, the maximum temperature difference (ΔT) of the reticle is higher than that of the reticle in the first state ST1. For example, the reticle has already absorbed sufficient energy to reach its saturation state STN before processing the last one of the semiconductor workpieces in the second lot L2. In some embodiments, the reticle absorbs sufficient energy to reach its saturation state STN before performing the eighth semiconductor workpiece in the second lot L2. In some embodiments, the reticle reaches its saturation state STN when performing the last few semiconductor workpieces in the second lot L2. As mentioned above, the overlay residual values of the last few semiconductor workpieces in the second lot L2 may be close to the control limit CL.

Still referring to FIG. 5 and FIG. 6, in some embodiments, after processing the last semiconductor workpiece (#25) in the second lot L2, the reticle stops absorbing energy from the illumination beam and may cool down until the first semiconductor workpiece (#1) in the third lot L3 starts to be processed. The maximum temperature difference (ΔT) of the reticle after performing the first semiconductor workpiece (#1) in the third lot L3 may be higher than that of the reticle in the first state ST1. The reticle may be heated to reach its saturation state STN very quickly when performing the subsequent semiconductor workpieces following the first semiconductor workpiece (#1) in the third lot L3. For example, the reticle absorbs sufficient energy to reach its saturation state STN before processing the fifth semiconductor workpiece in the third lot L3.

With reference to FIG. 6 and FIG. 7, the reticle in different states may be illustrated in different manners. For example, difference between the reticle in the first state ST1 and the saturation state STN can be illustrated using temperature profiles and distortion maps. FIG. 7 shows distortion maps having corresponding overlay offset vectors of the reticle in the first state ST1 and in the saturation state STN (which corresponding to the states illustrated in FIG. 6). In some embodiments, the distortion map in FIG. 7 includes a plurality of vectors corresponding to portions of distortions of the reticle caused by heating resulting from exposure to the illumination beam. For example, each vector has a direction that is a superposition of offsets (e.g., x-overlay offset, y-overlay offset, and z-overlay offset) on the reticle, and each vector represents a magnitude corresponding to the amount of displacement. The distortions of the reticle may be measured by any suitable methods (e.g., scanning, imaging, and/or the like) and may use any suitable metrology tools to perform the deformation measurements of the reticle. The distortions can be measured using the exposure tool's alignment system by determining the overlay errors. The method and means for measuring the distortion map of the reticle is not limited in the disclosure.

For example, the peripheral regions FR of the reticle on the reticle holder (e.g., the pair of fixing ends) or near to the reticle holder tend to have smaller misalignment than the other regions of the reticle. In some embodiments, the reticle experiences local thermal deformations during processing, which results in thermal expansion or contraction of some reticle regions relative to reticle wafer regions, so that the reticle in the first state ST1 deforms to have substantially non-planar geometry. In some embodiments, the reticle in the saturation state STN experiences thermal deformations and forms an upward arch. It should be noted that the temperature profiles and the distortion maps shown in FIG. 6 and FIG. 7 are merely examples, and the thermal distortions of the reticle may take various forms depending on different process parameters.

As shown in FIGS. 4A, 4B, 5, and 6, based on the plurality of overlay measurements for the respective semiconductor workpieces of individual lots, the sample data for the reticle including overlay information associated with the respective semiconductor workpieces in individual lots is generated. The sample data for various types of reticles may be established. In some embodiments, the sample data for the respective reticle collected in the exposure area and the information identifying the location of the reticle being in reticle library are correlated and stored in the storage medium of the computing device 150 (shown in FIG. 3). In some embodiments, the parameters (e.g., material, light transmission rate, open ratio/pattern density, thermal expansion coefficient, and the like) of the respective reticle may be correlated and stored in the storage medium 152 of the computing device 150. The data shown in FIGS. 4A, 4B, 5, and 6 may be viewed as empirical data. In some embodiments, the data is used to determine the temperature expansion saturation point of the respective reticle due to absorption of the exposure light. Given the temperature profile of the reticle in the saturation state STN, the overlay of the semiconductor workpiece may be compensated by adjusting at least one parameter (e.g., the position of optical unit, the position of the semiconductor workpiece) of the exposure tool before performing the exposure process.

Figure 8:
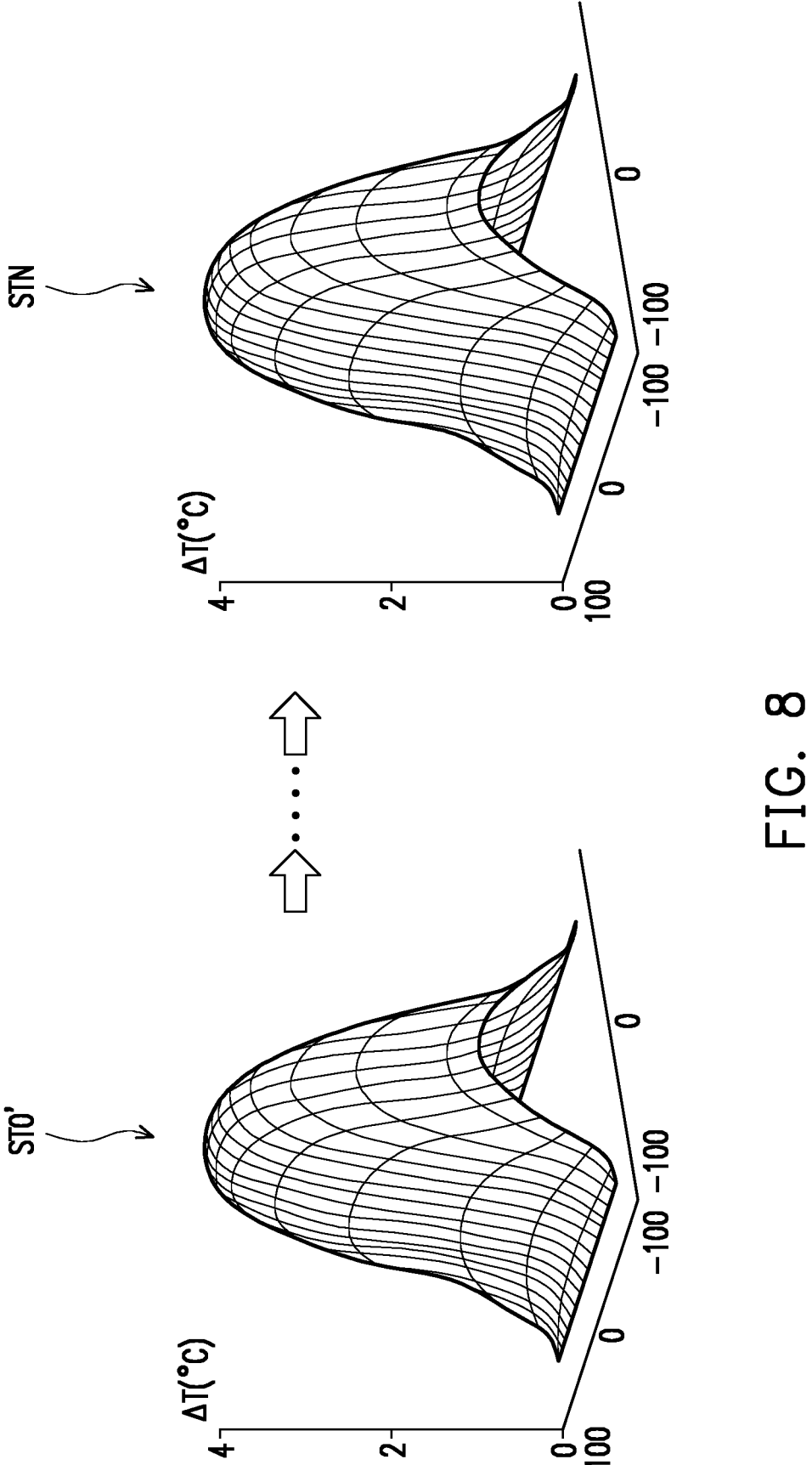
FIG. 8 is a schematic view illustrating temperature profiles of reticle in different states after adjustment according to some embodiments.

FIG. 8 is a schematic view illustrating temperature profiles of a reticle in different states after adjustment according to some embodiments. Referring to FIG. 8, to perform an actual exposure process on a semiconductor workpiece using a reticle selected from the reticle library, the saturation state STN of the selected reticle is determined based on the sample data as described above. For example, the temperature difference at different areas of the selected reticle is computed based on the data in accordance with the parameters (e.g., material, open ratio/pattern density) of the given reticle, so that the temperature profile of the selected reticle in the saturation state STN may be obtained. Subsequently, the selected reticle is regulated to reach the saturation state STN by applying sufficient amounts of thermal energy to the selected reticle before conducting the actual exposure process on the semiconductor workpiece. In some embodiments, the default state ST0' of the selected reticle is a state which has been regulated to be substantially equal to the saturation state STN. The selected reticle in the default state ST0' is then used to perform the actual exposure process on a first semiconductor workpiece of a first lot. In some embodiments, the default state ST0' of the selected reticle is a state of the reticle that is already thermally expanded to a saturation point, and the selected reticle is adjusted to be in the default state ST0' in the reticle library. The state of the selected reticle in the reticle library and in the exposure area may be equalized prior to performing the actual exposure process. The means for regulating the temperature of the reticles is described below. In some embodiments, after performing the actual exposure process on the plurality of semiconductor workpieces of the first lot, the reticle may remain at the saturation point (in the saturation state STN).

Figure 9:
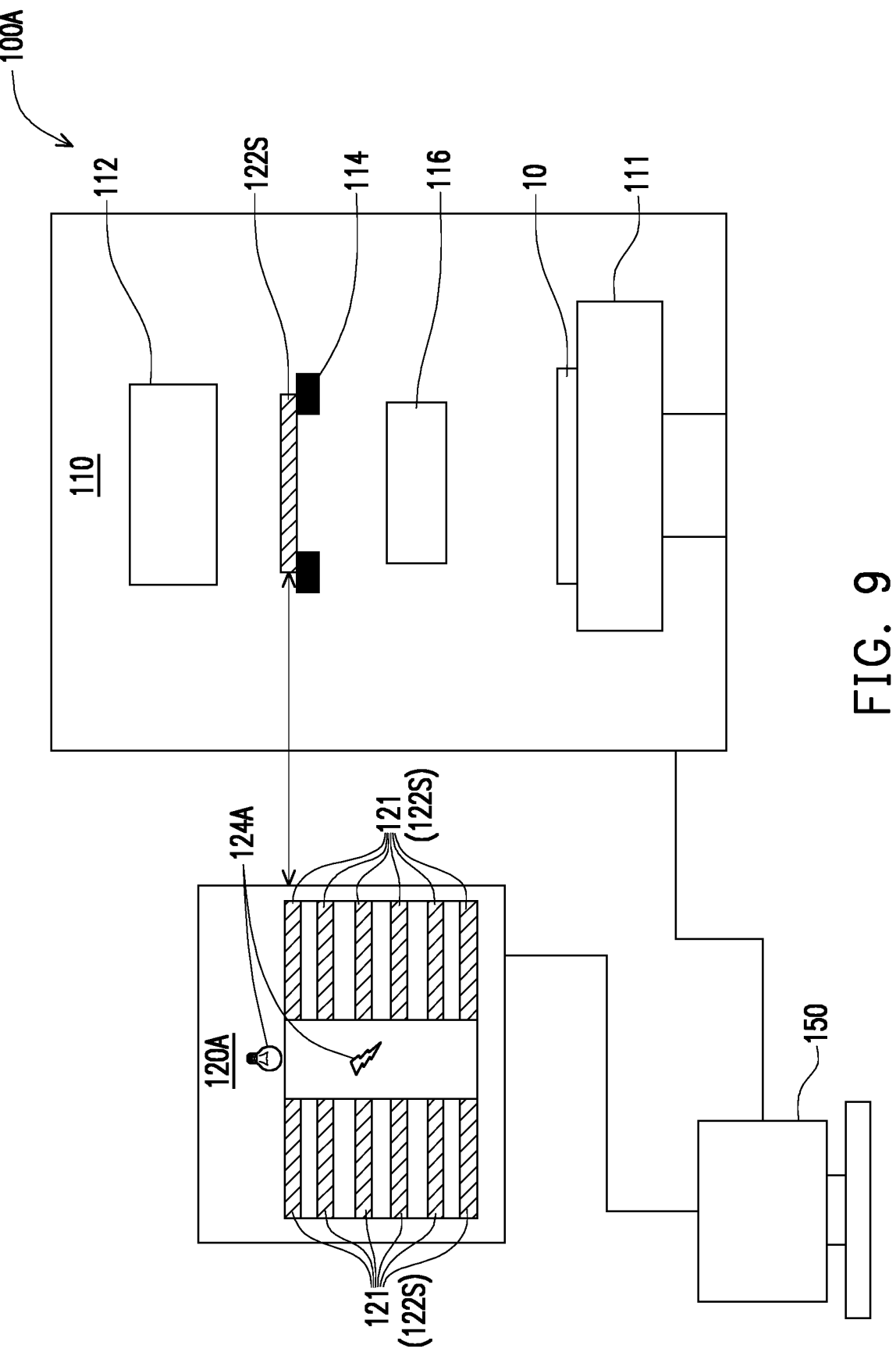
FIG. 9 is a schematic view illustrating a semiconductor processing system including thermal management of reticle according to some embodiments.
Figure 10:
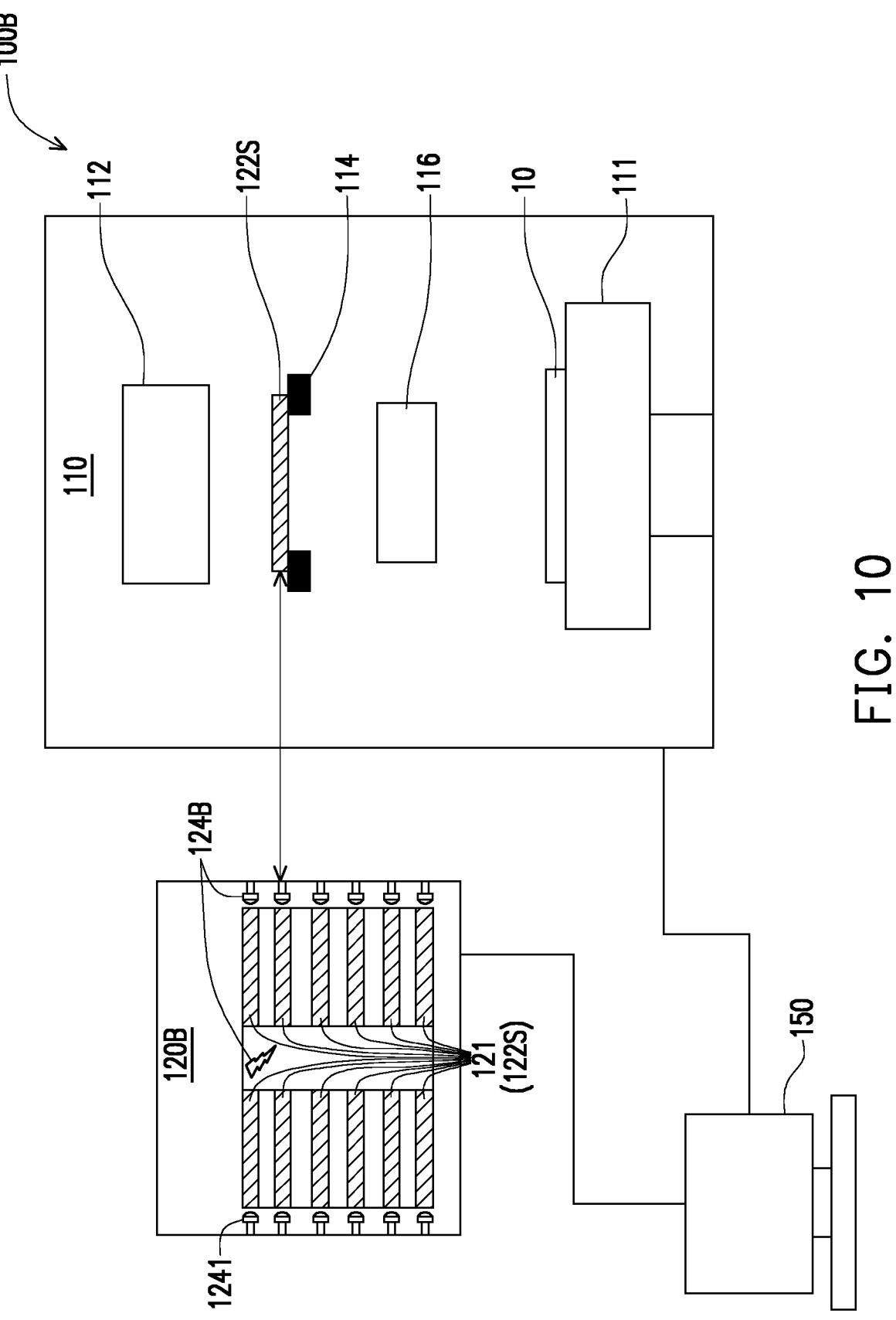
FIG. 10 is a schematic view illustrating a semiconductor processing system including thermal management of reticle according to some embodiments.

FIG. 9 and FIG. 10 are schematic views illustrating a semiconductor processing system including different thermal management configurations according to some embodiments. Referring to FIG. 9, a semiconductor processing system 100A is provided for performing a lithographic exposure process. The semiconductor processing system 100A is similar to the semiconductor processing system 100 described in FIG. 2, and like reference numerals are used to designate like elements. The difference between the semiconductor processing system 100A and 100 includes the reticle library 120A of the semiconductor processing system 100A. In some embodiments, the reticle library 120A includes a thermal-managing unit 124A thermally coupled to the slots 121 on which the reticles are disposed. The thermal-managing unit 124A may be configured to control the temperature of at least one reticle (e.g., 122S) which is selected to be used to perform a lithographic exposure process. In some embodiments, the thermal-managing unit 124A includes a heating component such as a radiation source, an electrically powered conductor (e.g., a coil), a wire mesh, an electrical resistance heater, a heating fluid, or any suitable element capable of applying thermal energy to the selected reticle 122S in the reticle library 120A. In some embodiments, the radiation source is or includes infrared (IR) radiation, a lamp configured to emit both heat and light, or the like.

An amount of heat (or an intensity of light) provided from the thermal-managing unit 124A is applied to the selected reticle 122S in the reticle library 120A, thereby allowing the selected reticle 122S to reach its saturation temperature. It should be noted that "122S" labeled in FIG. 9 represents the reticle that has already reached the saturation state. In some embodiments, the temperature of the selected reticle 122S, compared with the initial state, is increased by about 0.5° C. to about 1.5° C. The selected reticle 122S may be heated by more than 1.5° C. or less than 0.5° C. depending on several factors, such as characteristics of the selected reticle 122S, process recipe, time duration of heating, or the like. In some embodiments, the thermal-managing unit 124A includes a temperature sensor (not shown) for providing precise control of the heating temperature in the reticle library 120A. In some embodiments, the temperature sensor of the thermal-managing unit 124A is a sensing chip operatively disposed in the reticle library 120A for sensing the temperature that results from the heating component. In some embodiments, an amount of heat generated using the thermal-managing unit 124A is controllable by the controller 153 (shown in FIG. 3) of the computing device 150. The thermal-managing unit 124A and/or the controller 153 of the computing device 150 may be configured to control the electrical power of the heating component to maintain the temperature of the selected reticle 122S at the saturation point.

Referring to FIG. 10, a semiconductor processing system 100B is provided for performing a lithographic exposure process. The semiconductor processing system 100B is similar to the semiconductor processing system 100A, and like reference numbers are used to designate like elements.

The difference between the semiconductor processing system 100B and 100A includes a thermal-managing unit 124B of the reticle library. For example, the applied thermal energy may not be identical from slot to slot. Rather, the thermal energy applied to each slot 121 may be variable as required. In some embodiments, the thermal-managing unit 124B includes a plurality of heating components 1241, and each of the heating components 1241 corresponds to one of the slots 121. In some embodiments, the heating components 1241 include a radiation source configured to be irradiated onto the corresponding reticle for heating to the saturation temperature. Embodiments including other types of the heating components 1241 which are capable of applying thermal energy to the selected reticle in the reticle library 120B are also contemplated herein.

In some embodiments, the thermal energy generated from the heating components 1241 corresponding to the respective slot 121 is not the same. Different amounts of thermal energy may be applied to the reticles corresponding to the different types of the heating components 1241. In some embodiments, the heating components 1241 include different types of heaters. In other embodiments, the heating components 1241 are of the same type of heater, but the amount of thermal energy applied to the reticles 122S may be varied. The heating components 1241 may be similar to the types of the heating components described in FIG. 9. For example, the reticle which is selected to be used to perform the lithographic exposure process may absorb an amount of thermal energy from the corresponding heating component 1241, so that the selected reticle may reach its saturation state in the reticle library 120B prior to conducting the exposure process. In some embodiments, the respective heating component 1241 is controllable to be turned on and off. For example, the controller of the computing device is configured to turn on the heating component 1241 corresponding to the selected reticle 122S (e.g., one of the reticles in the reticle library 120B that is selected to be used to perform the lithographic exposure process), and other heating components 1241 corresponding to other reticles that are not selected may remain shut down.

FIG. 11A is a flow diagram illustrating an operating method of generating sample data according to some embodiments. Referring to FIG. 11A, an operating method 200A is provided. It is noted that an operating method 200A including the following operations is merely an example, and construes no limitation in the disclosure. While operating method 200A is illustrated and described below as a series of acts or operations, it should be understood that additional operation(s) may be provided before, during, and after the operating method 200A, certain operation(s) may be performed concurrently with other operations, and certain operation(s) may be omitted or may only be briefly described herein.

At the operation S202, a first sample workpiece (e.g., the semiconductor workpiece 10) is exposed by using a first reticle (e.g., the reticle 122). For example, the descriptions related to FIG. 1 and FIG. 2 correspond to the operation S202.

At the operation S204, after exposure in operation S202, the first reticle and the first sample workpiece are measured. In some embodiments, after performing a first exposing operation, the first reticle absorbs an amount of an exposing light (from the illumination beam) so that the first reticle is deformed. In some embodiments, the measuring of the first reticle is measuring the temperature profile (as shown in FIG. 4A) of the first reticle after the first time of the exposing. After performing the exposure, the first sample workpiece is measured to determine the overlay, and the overlay residual value of the first sample workpiece is calculated.

At operation S206, the exposing and the measuring are repeated several times. In some embodiments, after measuring, the exposure process is performed on a second sample workpiece by using the first reticle, and then after the exposure process, the temperature profile of the first reticle and the overlay of the second sample workpiece are measured. The operations S202 and S204 may be performed multiple times to expose and measure a plurality of sample reticles of multiple lots in sequence. In some embodiments, the first reticle is measured when reaching its saturation state, where when the first reticle is in the saturation state, the first reticle is at the saturation temperature. For example, when the first reticle absorbs a sufficient amount of thermal energy (e.g., the exposure light), the first reticle reaches its saturation state, and the deformation of the reticle is substantially unchanged as the exposure process continues.

At the operation S208, the measurement of the first reticle and the sample workpiece are correlated to generate a sample data. For example, FIG. 5 illustrates a sample data of some embodiments corresponding to the operation S208.

After performing a series of the exposure processes by using the first reticle, the first reticle may be replaced with a second reticle and the operating method 200A may be repeated by using the second reticle to generate sample data regarding the second reticle. The first reticle may have an open ratio that is different from the second reticle, where the open ratio of the first reticle may be the ratio of the open area (area unmasked by the pattern) to the pattern area (area covered by the pattern). The operating method 200A may be performed by using a plurality of reticles that have different open ratios so as to generate robust sample data. In some embodiments, the sample data correlates the characteristic (e.g., material, light transmission rate, open ratio/pattern density, thermal expansion coefficient, temperature profiles, distortion maps, or the like) of the respective sample reticle to the overlay residual values of the sample workpieces so that when performing an actual exposure process, an overlay compensation may be determined on the basis of the sample data. Once the robust sample data is established, an actual exposure process may be efficiently performed on the basis of the sample data.

FIG. 11B is a flow diagram illustrating an operating method of reticle thermal management in semiconductor manufacturing according to some embodiments. Referring to FIG. 11B, an operating method 200B is provided. It is noted that an operating method 200B including the following operations is merely an example, and construes no limitation in the disclosure. While the operating method 200B is illustrated and described below as a series of acts or operations, it should be understood that additional operation(s) may be provided before, during, and after the operating method 200B, certain operation(s) may be performed concurrently with other operations, and certain operation(s) may be omitted or may only be briefly described herein.

At the operation S210, a saturation temperature of a reticle is determined based on the sample data. In some embodiments, the saturation temperature of the reticle is defined as a temperature on the reticle in the saturation state (STN of FIG. 6). In some embodiments, with reference to FIG. 9 or FIG. 10, the reticle is selected from the reticle library 120 to be used to perform an exposure process. The saturation temperature of the selected reticle is calculated by the computing device 150. In some embodiments, the sample data (e.g., the data shown in FIGS. 5-7) and the parameters (e.g., material, light transmission rate, open ratio/pattern density, thermal expansion coefficient, or the like) required to calculate the saturation temperature of the selected reticle are already stored in the storage medium (storage medium 152 labelled in FIG. 3) of the computing device 150. In some embodiments, a reticle in the reticle library is selected to perform an actual exposure process, where the selected reticle may be the same as the sample reticle or the selected reticle may have characteristics (e.g., material, light transmission rate, open ratio/pattern density, thermal expansion coefficient, or the like) substantially the same or similar to the sample reticle. Based on the sample data collected by performing the exposure process using the sample reticle, the saturation temperature of the reticle is determined.

At the operation S220, the saturation temperature of the reticle is compared with the current temperature of the reticle in the reticle library to determine the temperature difference therebetween. For example, the current temperature of the selected reticle in the reticle library may be about 21° C. and the saturation temperature of the selected reticle is predicted to be about 22° C. As such, the temperature difference between the current temperature and the saturation temperature of the selected reticle is about 1° C. In some embodiments, the temperature difference ranges from about 0.5° C. to about 1.5° C. It should be noted that the current temperature and the saturation temperature of the reticle described above is an example and may vary depending on different factors. In some embodiments, the computation of the temperature difference is performed by the computing device (computing device 150 labelled in FIG. 9 or FIG. 10) after determining which one of the reticles in the reticle library is used to perform the actual exposure process.

At the operation S230, the temperature of the reticle in the reticle library is regulated based on the temperature difference. In some embodiments, with reference to FIG. 9 or FIG. 10, after calculating the temperature difference between the current temperature and the saturation temperature of the selected reticle, the controller of the computing device 150 is configured to turn on the heating component of the thermal-managing unit 124A (or the heating component 1241 corresponding to the selected reticle as shown in FIG. 10) to apply thermal energy to the selected reticle. In some embodiments in which the temperature difference is about 1° C., a rise in the temperature of the selected reticle in the reticle library is about 1° C. by using the heating component of the thermal-managing unit.

When the selected reticle reaches its saturation state, the selected reticle is ready to be used to carry out the lithographic exposure process. Therefore, the selected reticle is transferred from the reticle library to the exposure area, and then the lithographic exposure process is performed on the semiconductor workpiece through the use of the selected reticle. In some embodiments, the semiconductor workpiece to be processed is a wafer including a plurality of fields having integrated circuits defined therein, and each field may have one or more semiconductor dies. In some embodiments in which the exposure tool is a scanner, when the exposure process is performed, the wafer is exposed in one field, and then the reticle is stepped to the next field and repeats the scanning process to transfer the pattern of the reticle to the next field. In some embodiments, after the exposure process is applied to the semiconductor workpiece that includes a photosensitive layer formed over the wafer, the photosensitive layer is subsequently developed by a developing chemical to form a patterned layer that has various openings for subsequent semiconductor processing, such as etching or the like.

The saturation temperature of the selected reticle is calculated according to the sample data, such that the amount of thermal distortion (e.g., distortion map shown in FIG. 7) in the selected reticle at the saturated temperature may also be determined on the basis of the sample data. The compensation value for controlling the overlay of the semiconductor workpiece caused by thermal deformation of the reticle may be calculated by the computing device (such as computing device 150) based on the degree of thermal distortion in the selected reticle. It is appreciated that reticle heating and optical unit heating may result in the overlay error of the processed semiconductor workpiece. The optical unit heating may be compensated by a feed-forward control algorithm, and reticle heating may be compensated by calculating the compensation value corresponding to the thermal distortion to the reticle. The overlay compensation may involve adjusting the optical unit (e.g., regulating the optical path), re-positioning the semiconductor workpiece to be processed via the chuck, regulating the position of the reticle via the reticle holder, and/or the like. In some embodiments, the operation of overlay compensation is performed after selecting the reticle to be used to perform the lithographic exposure process and/or after the operation S210 (determining the saturation temperature of the reticle based on the sample data). The operation of overlay compensation may be performed before, during, or after the operation S220 or the operation S230. In some embodiments, the operating method 200B conducted in the reticle library is performed concurrently with the operation of overlay compensation conducted in the exposure area.

Figure 12:
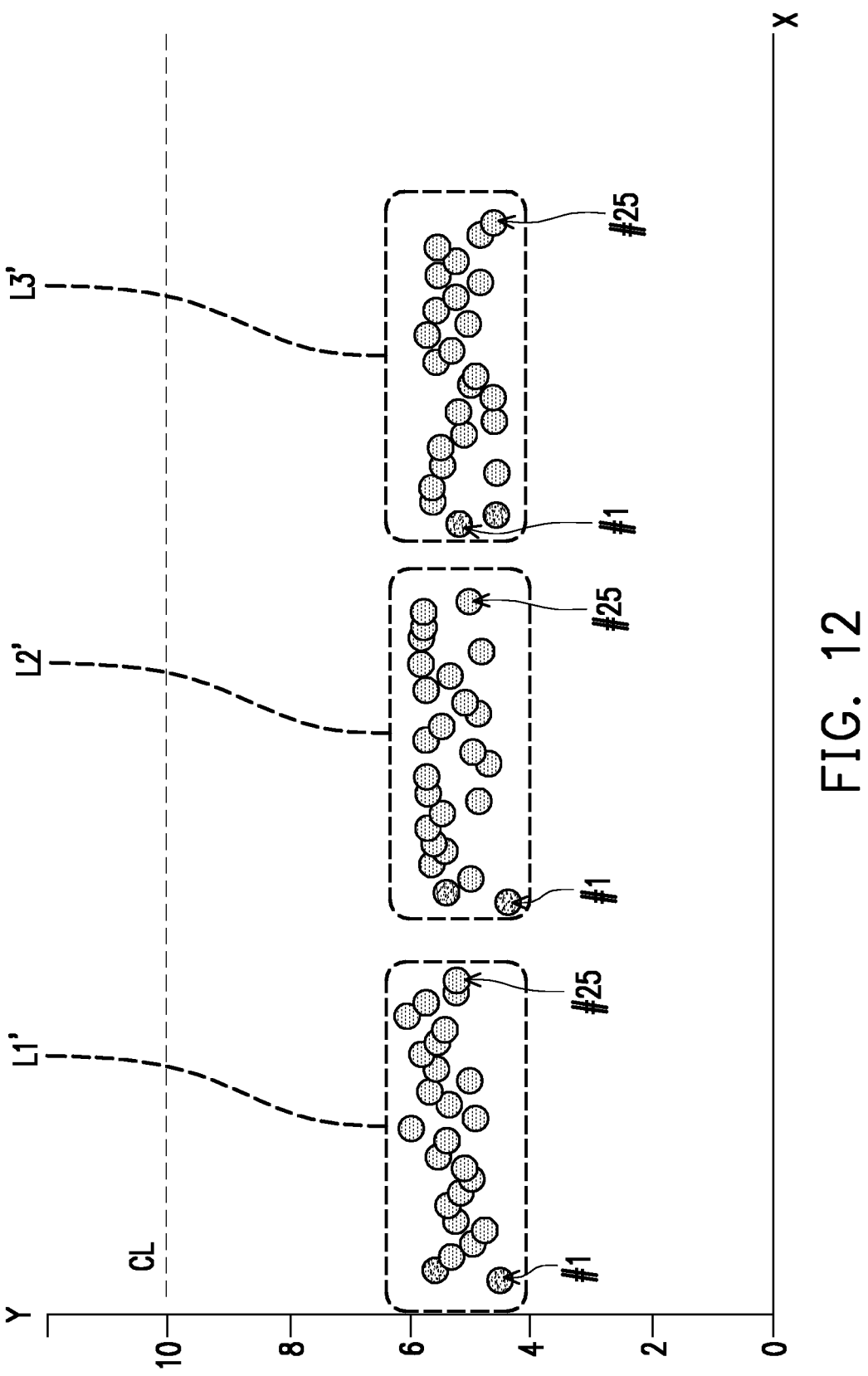
FIG. 12 is a schematic diagram of actual data corresponding to semiconductor workpieces of individual lots according to some embodiments.

FIG. 12 is a schematic diagram of data corresponding to semiconductor workpieces of individual lots according to some embodiments. Referring to FIG. 12, the overlay residual values of the respective semiconductor workpiece are measured when an exposure process is performed using the operation methods described above. The data shown in FIG. 12 includes the Y axis (i.e. vertical axis) representing the overlay residual value, and the X axis (i.e. horizontal axis) representing data points corresponding to semiconductor workpieces of the respective lots processed in time sequence. The measuring method of the overlay residual value is similar to the measuring method described in FIG. 5, so the detailed descriptions are not repeated for brevity.

The selected reticle (e.g., 122S labelled in FIG. 9 or FIG. 10) is regulated to reach its saturation state prior to conducting the exposure process. When exposing a pattern of the selected reticle onto the first semiconductor workpiece (#1) of the first lot L1', the selected reticle remains in its saturation state. Shape of the selected reticle in the saturation state is substantially constant, such that the overlay residual values of the respective semiconductor workpiece of the first lot L1' may be well-controlled. As shown in FIG. 12, the overlay residual values of every semiconductor workpiece in the individual lots L1', L2', L3' are controlled to within control limit CL (e.g., 10 nm), even for the last semiconductor workpiece (#25) in the third lot L3'.

According to some embodiments, a method includes at least the following steps. An exposure process is performed on a semiconductor workpiece and includes selecting a target state of a reticle based on given data and regulating the reticle to reach the target state. A development process is performed on the semiconductor workpiece.

According to some alternative embodiments, a method includes at least the following steps. An exposure process is performed on a semiconductor workpiece and includes determining a target temperature of a reticle on the basis of given data from a plurality of semiconductor workpieces; matching a temperature of the reticle to the target temperature; and exposing the semiconductor workpiece using the reticle at the target temperature. The given data includes an overlay result data of the semiconductor workpieces and thermal deformation profiles of the reticle.

According to some alternative embodiments, a method includes at least the following steps. A sample workpiece is exposed by using a sample reticle. An exposure process is performed on a semiconductor workpiece and includes exposing a first workpiece by using a first reticle; measuring a temperature profile of the first reticle after the exposing; repeating the exposing and the measuring to generate data; determining a target state of the first reticle on the basis of the data; regulating a second reticle to reach a state that is substantially equal to the target state of the first reticle; and exposing the semiconductor workpiece by using the second reticle.

The foregoing outlines workpieces of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   producing a data set, comprising:
      exposing a plurality of workpieces using a sample reticle by an exposure tool to obtain processed workpieces;
      measuring overlay values of the processed workpieces after exposure by the exposure tool;
      establishing a relationship between the overlay values of the processed workpieces and a control limit of the processed workpieces; and
      measuring temperature profiles of the sample reticle that are related to the overlay values of the processed workpieces after exposure by the exposure tool;
   selecting a target state of a reticle based on the data set, wherein the target state is a state in which a deformation of the reticle is substantially unchanged;
   regulating the reticle to reach the target state; and
   performing an exposure process on a target workpiece by using the reticle.

2. The method of claim 1, wherein selecting the target state of the reticle comprises:
   determining a target temperature of the reticle based on the data set, wherein when the reticle is at the target temperature, the deformation of the reticle is substantially unchanged by added exposure.

3. The method of claim 2, further comprising:
   calculating a difference between the target temperature of the reticle and a current temperature of the reticle before regulating the reticle to reach the target state.

4. The method of claim 3, wherein regulating the reticle to reach the target state comprises:
   changing the temperature of the reticle from the current temperature to substantially the target temperature.

5. The method of claim 1, wherein regulating the reticle to reach the target state comprises:

applying an amount of thermal energy to the reticle stored in a reticle library.

6. The method of claim 5, wherein a plurality of the reticles is stored in the reticle library, and applying the amount of thermal energy comprises:

applying at least two different amounts of thermal energy to the plurality of the reticles stored in the reticle library.

7. The method of claim 1, wherein the temperature profiles of the sample reticle are measured by a temperature sensing unit.

8. The method of claim 1, wherein an open ratio of the reticle is substantially equal to that of the sample reticle.

9. A method, comprising:

calculating a target temperature of a reticle on the basis of given data from a plurality of workpieces by a computing device, wherein the given data comprises an overlay result data of the workpieces and parameters of the reticle, and the parameters of the reticle comprise a material, a light transmission rate, an open ratio, a thermal expansion coefficient, deformation profiles, or distortion maps;

matching a temperature of the reticle to the target temperature; and performing an exposure process on a target workpiece using the reticle at the target temperature in an exposure area coupled to the computing device, wherein when the reticle is at the target temperature, the reticle reaches a state in which the reticle is substantially free of deformation as the exposure process continues.

10. The method of claim 9, further comprising:

before calculating the target temperature of the reticle, measuring the deformation profiles of the reticle.

11. The method of claim 9, wherein matching the temperature of the reticle to the target temperature comprises:

heating the reticle stored in a reticle library coupled to the computing device to reach substantially the target temperature.

12. The method of claim 11, further comprising after the heating:

transferring the reticle stored in the reticle library to the exposure area to conduct the exposure process.

13. The method of claim 11, wherein a plurality of reticles is stored in the reticle library, the method further comprises:

heating the plurality of the reticles stored in the reticle library.

14. The method of claim 11, wherein the reticle is heated by using a heating component coupled to the computing device to apply an amount of thermal energy to the reticle.

15. The method of claim 9, further comprising before performing the exposure process:

adjusting a parameter of an exposure tool based on the reticle that is at the target temperature.

16. A method, comprising:

exposing a workpiece by using a reticle;

measuring a temperature profile of the reticle and an overlay of the workpiece;

correlating the overlay of the workpiece to the temperature profile of the reticle;

repeating the exposing, the measuring and the correlating to generate a target overlay performance data;

determining a target state of the reticle on the basis of the target overlay performance data;

regulating a target reticle to reach a state that is similar to the target state of the reticle;

adjusting a parameter of an exposure tool on the basis of the target overlay performance data; and performing an exposure process on a plurality of target workpieces by using the target reticle, wherein after the reticle reaches the target state, a deformation of the reticle is substantially unchanged as the exposure process continues.

17. The method of claim 16, wherein when repeating the exposing by using the reticle, the reticle absorbs an amount of an exposing light to reach the target state.

18. The method of claim 16, wherein regulating the target reticle comprises:

selecting the target reticle in a reticle library, wherein an open ratio of the target reticle is substantially equal to that of the reticle; and applying an amount of thermal energy to the target reticle in the reticle library.

19. The method of claim 18, after applying the amount of thermal energy to the target reticle, further comprising:

transferring the target reticle in the reticle library to an exposure area to conduct the exposure process.

20. The method of claim 16, wherein after performing the exposure process on the plurality of target workpieces, the target reticle remains at the target state.

* * * * *